United States Patent
McBride (12)

(10) Patent No.: US 6,295,632 B1
(45) Date of Patent: Sep. 25, 2001

(54) SYSTEM AND METHOD FOR DETECTING THE OUTPUT OF A CLOCK DRIVER

(75) Inventor: John G McBride, Ft Collins, CO (US)

(73) Assignee: Hewlett Packard Company, Palo Alto, CA (US)

( * ) Notice: Subject to any disclaimer, the term of this patent is extended or adjusted under 35 U.S.C. 154(b) by 0 days.

(21) Appl. No.: 09/311,314

(22) Filed: May 13, 1999

(51) Int. Cl.[7] .................................................. G06F 9/45
(52) U.S. Cl. ...................... 716/6; 716/1; 716/5; 703/14; 703/15; 703/19
(58) Field of Search .................................. 703/14, 19, 15; 716/6, 18, 1; 438/10

(56) References Cited

U.S. PATENT DOCUMENTS

| | | | |
|---|---|---|---|
| 5,657,239 | * 8/1997 | Grodstein et al. | 716/6 |
| 5,751,596 | * 5/1998 | Ginetti et al. | 716/6 |
| 5,798,938 | * 8/1998 | Heikes et al. | 716/6 |
| 6,014,510 | * 1/2000 | Burks et al. | 703/19 |
| 6,038,381 | * 3/2000 | Munich et al. | 716/1 |
| 6,044,211 | * 3/2000 | Jain | 716/18 |
| 6,077,717 | * 6/2000 | McBride | 438/10 |

OTHER PUBLICATIONS

Savithri, et al., "A Three–tier Assertion Technique for Spice Verification of Transistor Level Timing Analysis"; Twelfth International Conference on VLSI Design, 1999, pp. 175–180.*

* cited by examiner

Primary Examiner—Matthew S. Smith
Assistant Examiner—Jibreel Speight

(57) ABSTRACT

The present invention is generally directed to a system and method for evaluating a netlist of a schematic to detect the output of a clock driver. In accordance with one embodiment of the invention, a method is provided for determining whether a circuit node is an output node of a clock driver circuit. The method includes the steps of ensuring that the node is a clock node, ensuring that the node is a node within an inverter loop, identifying every FET that is channel connected to the node, and, for every identified FET, ensuring that a signal that drives a gate node of the FET also drives a gate node of a different type FET. With these primary tests satisfied, the method determines the node under consideration to be an output node of a clock driver circuit. In accordance with another aspect of the invention, a method determines whether a circuit node is an output node of a clock driver circuit by ensuring that the node is a node within an inverter loop, and ensuring that a gate node of every FET (i.e., first FET) that is channel connected to the node is electrically connected to a gate node of another FET, wherein the another FET is a different type than the first FET. In accordance with yet another aspect of the invention, a corresponding computer readable medium is provided.

15 Claims, 11 Drawing Sheets

NODE{ ~~~
~~~
CLOCK
CLOCK OUTPUT
STATIC INVERSE OF (POINTER)
~~~
~~~}
FIG. 4
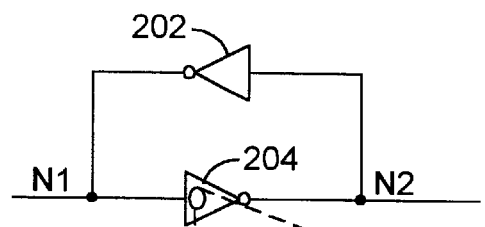
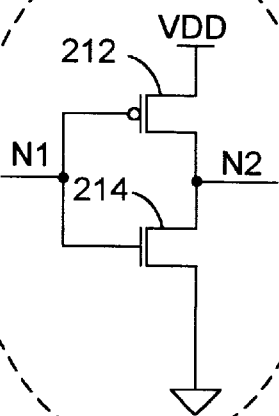
FIG. 5

SYSTEM AND METHOD FOR DETECTING THE OUTPUT OF A CLOCK DRIVER

BACKGROUND OF THE INVENTION

1. Field of the Invention

The present invention generally relates to computer-aided circuit design systems, and more particularly to a system and method for evaluating a netlist file and detecting the output of a clock driver.

2. Discussion of the Related Art

Integrated circuits are electrical circuits comprised of transistors, resistors, capacitors, and other components on a single semiconductor "chip" in which the components are interconnected to perform a given function such as a microprocessor, programmable logic device (PLD), electrically erasable programmable memory (EEPROM), random access memory (RAM), operational amplifier, or voltage regulator. A circuit designer typically designs the integrated circuit by creating a circuit schematic indicating the electrical components and their interconnections. Often, designs are simulated by computer to verify functionality and ensure performance goals are satisfied.

In the world of electrical device engineering, the design and analysis work involved in producing electronic devices is often performed using electronic computer aided design (E-CAD) tools. As will be appreciated, electronic devices include electrical analog, digital, mixed hardware, optical, electro-mechanical, and a variety of other electrical devices. The design and the subsequent simulation of any circuit board, VLSI chip, or other electrical device via E-CAD tools allows a product to be thoroughly tested and often eliminates the need for building a prototype. Thus, today's sophisticated E-CAD tools may enable the circuit manufacturer to go directly to the manufacturing stage without costly, time consuming prototyping.

In order to perform the simulation and analysis of a hardware device, E-CAD tools must deal with an electronic representation of the hardware device. A "netlist" is one common representation of a hardware device. As will be appreciated by those skilled in the art of hardware device design, a "netlist" is a detailed circuit specification used by logic synthesizers, circuit simulators and other circuit design optimization tools. A netlist typically comprises a list of circuit components and the interconnections between those components.

The two forms of a netlist are the flat netlist and the hierarchical netlist. Often a netlist will contain a number of circuit "modules" which are used repetitively throughout the larger circuit. A flat netlist will contain multiple copies of the circuit modules essentially containing no boundary differentiation between the circuit modules and other components in the device. By way of analogy, one graphical representation of a flat netlist is simply the complete schematic of the circuit device.

In contrast, a hierarchical netlist will only maintain one copy of a circuit module which may be used in multiple locations. By way of analogy, one graphical representation of a hierarchical netlist would show the basic and/or non-repetitive devices in schematic form and the more complex and/or repetitive circuit modules would be represented by "black boxes." As will be appreciated by those skilled in the art, a black box is a system or component whose inputs, outputs, and general function are known, but whose contents are not shown. These "black box" representations, hereinafter called "modules", will mask the complexities therein, typically showing only input/output ports.

An integrated circuit design can be represented at different levels of abstraction, such as the Register-Transfer level (RTL) and the logic level, using a hardware description language (HDL). VHDL and Verilog are examples of HDL languages. At any abstraction level, an integrated circuit design is specified using behavioral or structural descriptions or a mix of both. At the logical level, the behavioral description is specified using boolean equations. The structural description is represented as a netlist of primitive cells. Examples of primitive cells are full-adders, NAND gates, latches, and D-Flip Flops.

Having set forth some very basic information regarding the representation of integrated circuits and other circuit schematics through netlists, systems are presently known that use the information provided in netlists to evaluate circuit timing and other related parameters. More specifically, systems are known that perform a timing analysis of circuits using netlist files. Although the operational specifics may vary from system to system, generally such systems operate by identifying certain critical timing paths, then evaluating the circuit to determine whether timing violations may occur through the critical paths. As is known, timing specifications may be provided to such systems by way of a configuration file.

One such system known in the prior art is marketed under the name PathMill, by EPIC Design Technology, Inc. (purchased by Synopsys). PathMill is a transistor-based analysis tool used to find critical paths and verify timing in semiconductor designs. Using static and mixed-level timing analysis, PathMill processes transistors, gates, and timing models. It also calculates timing delays, performs path searches, and checks timing requirements. As is known, PathMill can analyze combinational designs containing gates, and sequential designs containing gates, latches, flip-flops, and clocks. Combinational designs are generally measured through the longest and shortest paths.

While tools such as these are useful for the design verification process after layout, there are various circuit characteristics, attributes, or configurations that are not identified and/or addressed in the PathMill product and other similar products. For example, there is often a need to evaluate a circuit to detect clock driver outputs. By way of a particular example, it is generally undesirable for a clock driver to drive either an excessive number of gates or too few gates. Of course, the number of gates that may be driven by a given clock driver will necessarily vary depending upon the size/strength of the driver, as well as the capacitance at the output of the clock driver.

Accordingly, it is often desirable to provide a system and/or method that is capable of evaluating a netlist to identify clock driver outputs so that they may be evaluated to determine whether they are designed to sufficiently drive the surrounding circuitry, in order to obtain a higher quality circuit design. Of course, others reasons may also exist for identifying clock driver outputs.

SUMMARY OF THE INVENTION

Certain objects, advantages and novel features of the invention will be set forth in part in the description that follows and in part will become apparent to those skilled in the art upon examination of the following or may be learned with the practice of the invention. The objects and advantages of the invention may be realized and obtained by means of the instrumentalities and combinations particularly pointed out in the appended claims.

The present invention is generally directed to a system and method for evaluating a netlist of a schematic to detect the output of a clock driver. In accordance with one embodiment of the invention, a method is provided for determining whether a circuit node is an output node of a clock driver circuit. The method includes the steps of ensuring that the node is a clock node, ensuring that the node is a node within an inverter loop, identifying every FET that is channel connected to the node, and, for every identified FET, ensuring that a signal that drives a gate node of the FET also drives a gate node of a different type FET. With these primary tests satisfied, the method determines the node under consideration to be an output node of a clock driver circuit.

In a preferred embodiment, the method also includes additional steps. For example, the method determines whether the node has a static inverse. The method may perform this step by evaluating a data structure for the node. More specifically, the method may evaluate a data structure for the node to determine whether a static inverse pointer, within the data structure, points to another node. The method may also determine whether it (the node itself) is the static inverse of the static inverse node pointed to by the static inverse pointer of the data structure for the node. More particularly, and after evaluating the data structure for the node to determine its static inverse node, the method evaluate the data structure for the static inverse node to ensure that the static inverse pointer of that data structure points back to the node under evaluation.

In accordance with another aspect of the invention, a method determines whether a circuit node is an output node of a clock driver circuit by ensuring that the node is a clock node, ensuring that the node is a node within an inverter loop, and ensuring that a gate node of every FET (i.e., first FET) that is channel connected to the node is electrically connected to a gate node of another FET, wherein the another FET is a different type than the first FET.

In accordance with yet another aspect of the present invention, a computer readable medium is provided for controlling the execution of a method for determining whether a node is an output node of a clock driver. The computer readable medium comprises program code, including a first segment configured to ensure that the node is a node within an inverter loop, a second segment configured to identify every FET that is channel connected to the node, and a third segment configured to ensuring that a signal that drives a gate node of the FET also drives a gate node of a different type FET, for every identified FET.

DESCRIPTION OF THE DRAWINGS

The accompanying drawings incorporated in and forming a part of the specification, illustrate several aspects of the present invention, and together with the description serve to explain the principles of the invention. In the drawings:

FIG. 4 is a diagram illustrating a portion of a data structure for a circuit node within a netlist file;

FIG. 5 is a schematic diagram illustrating an inverter loop;

DETAILED DESCRIPTION OF THE PREFERRED EMBODIMENT

Figure 1:
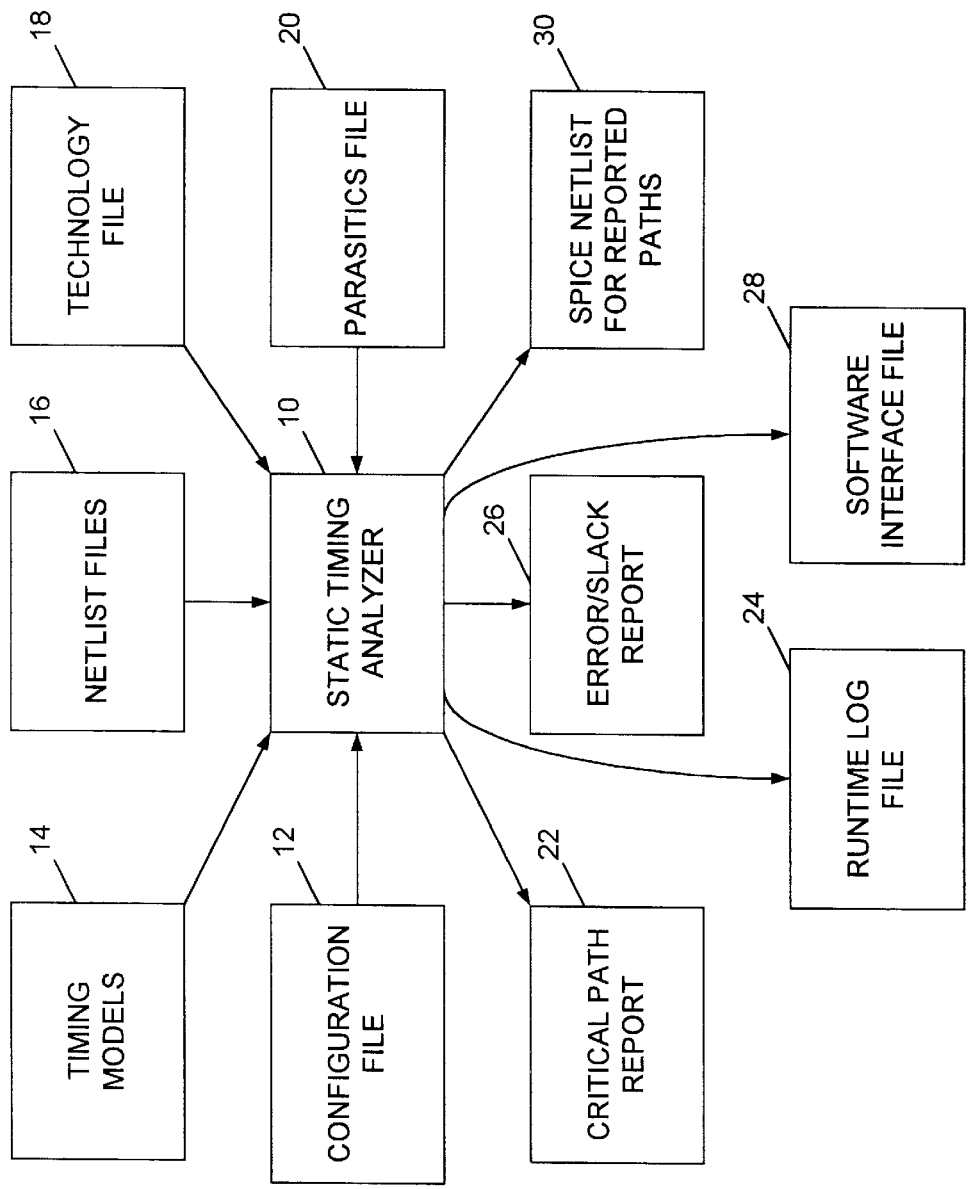
FIG. 1 is a block diagram of a static timing analyzer system, as is known in the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary, the intent is to cover all alternatives, modifications and equivalents included within the spirit and scope of the invention as defined by the appended claims.

Referring now to the drawings. reference is made to FIG. 1, which is a block diagram of a prior art static timing analyzer program that illustrates the basic informational flow in such a system. Specifically, and as previously mentioned, one such system is marketed under the name PathMill. FIG. 1 is a diagram that illustrates the informational flow in the PathMill system. At the center of the diagram is a block denoted as static timing analyzer 10, which represents the PathMill program. Surrounding this block 10 are a number of other blocks that represent various input and output files and/or information.

More particularly, the PathMill program may utilize a configuration file 12, a file of timing models 14, one or more netlist files 16, a technology file 18, and a parasitic file 20, for various input information. In addition, the PathMill program may generate a number of different output files or other output information, including a critical path report 22, a runtime log file 24, an error report 26, a software interface file 28, and a SPICE netlist 30. When started, the PathMill program first processes the input netlist file(s) 16, the technology file 18, and the configuration file(s) 12. The information from these files is subsequently used for performing path analyses. Since the PathMill program is publicly available and marketed, its function and operation are well known, and therefore need not be discussed in detail herein.

For purposes of illustrating the present invention, much of the diagram and information illustrated in FIG. 1 is not shown in connection with the inventive system. In this regard, reference is made to FIG. 2, which shows one embodiment of a system constructed in accordance with the present invention. In the illustrated embodiment, only the static timing analyzer 10, the configuration file 12 and the netlist file 16 of FIG. 1 are shown. The configuration file(s) 12 contains information that informs the static timing analyzer 10 how to perform its analysis, and various numbers of configuration files may be used. The netlist file 16, as is known, defines the various integrated circuit components, and their interrelations.

Figure 2:
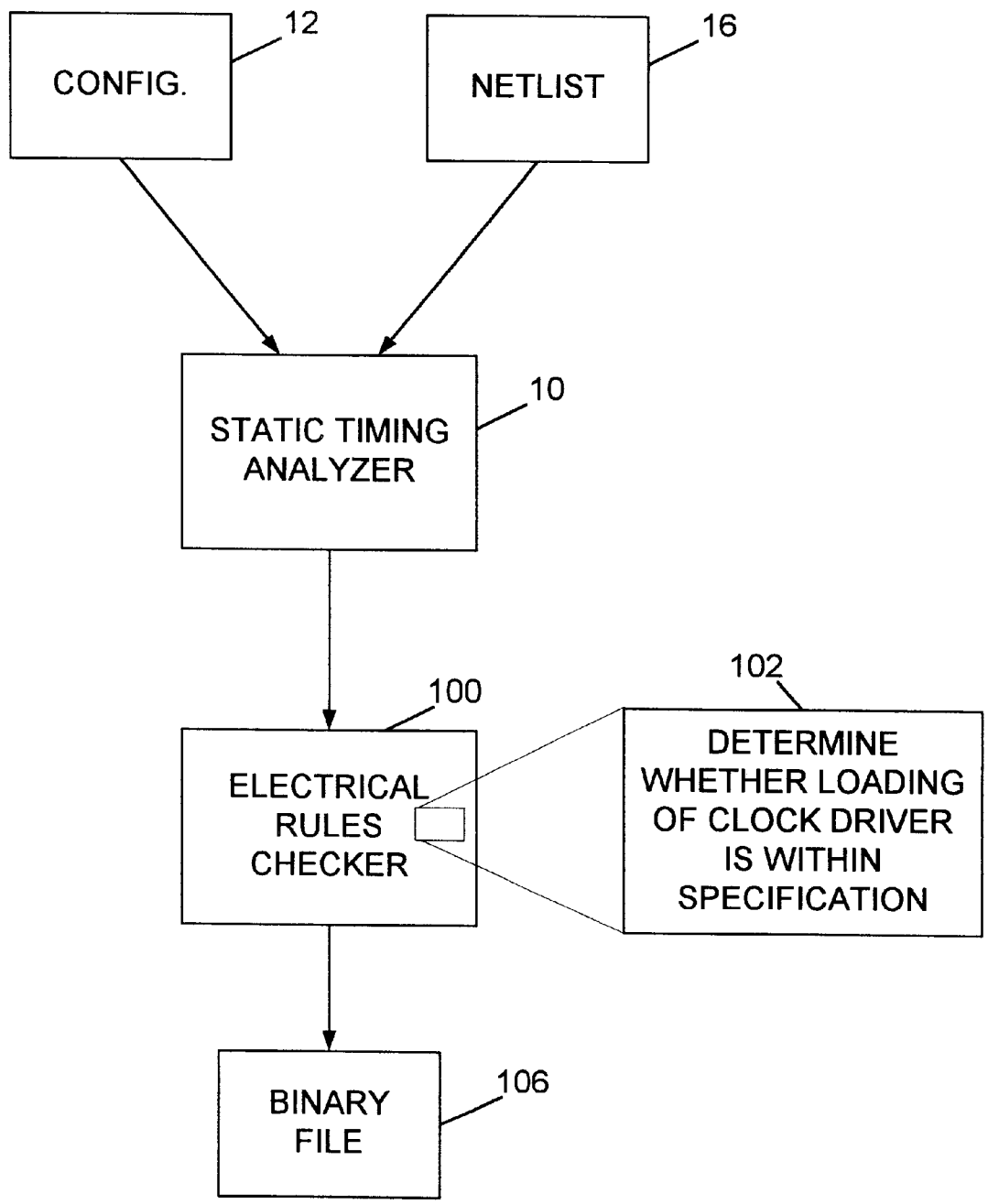
FIG. 2 is a block diagram illustrating the orientation of the electrical rules checking method of the present invention, in relation to an existing static timing analyzer.

The system shown in FIG. 2 preferably utilizes a computer (not shown) for its operation which runs the static timing analyzer program 10 and the electrical rules checker program 100. The computer may be electrically coupled to a memory device (not shown) which functions as a system storage unit for storing the code and data utilized and/or generated by the system. Those skilled in the art will realize that the present invention is not limited to any particular type of computer or memory device for performing these functions.

It should also be noted that the term "computer", as that term is used herein, is intended to denote any machine capable of performing the calculations, or computations, necessary to perform the tasks of the present invention. In essence, this includes any machine that is capable of accepting a structured input and of processing the input in accordance with prescribed rules to produce an output. Furthermore, those skilled in the art will understand that the system shown in FIG. 2 may be implemented in hardware, software, or a combination of both, and is not limited to any particular physical, structural, or electrical configuration.

The electrical rules checker 100 program of the present invention is preferably configured to operate on an output of the static timing analyzer 10. In this regard, the static timing analyzer may be configured to generate an output netlist database, which the electrical rules checker 100 of the present invention utilizes as an input. As previously mentioned, there are a wide variety of reasons why an electrical rules checking program may be desired. One such reason is to perform various checks over certain rules or strategies in an integrated circuit design. Such rules may vary from circuit to circuit, depending upon the particular application. For example, a portion 102 of the electrical rules checker program I 00 operates to detect an output node of a clock driver circuit.

As is known, a large scale integrated circuit design is often done at the FET level. A designer may utilize thousands of interconnected FETs in designing a portion of an integrated circuit. Although the designer may make every effort to follow certain design guidelines, mistakes may nevertheless be made. Accordingly, the electrical rules checker 100 of the present invention provides an excellent mechanism for double-checking designs and design layouts. Furthermore, the electrical rules checker 100 of the present invention may generate an output binary file 106, which may ultimately be used in subsequent executions of the electrical rules checker 100.

However, prior to the electrical rules checker 100 of the present invention performing any of the rules checking tasks, a database of nodes and elements of the circuit to be evaluated is generated. This database is then utilized by the electrical rules checker 100 of the present invention to perform the rules checking tasks. However, it should be noted that the database and the method in which it is generated is not limited to use with any particular rules checker. They may be used with virtually any type of rules checker which evaluates nodes for design quality. For example, the database of the present invention may also be used with rules checkers which evaluate nodes for optical computing systems, mechanical systems and chemical systems. It will be apparent to those skilled in the art how data structures similar to those generated for elements and nodes in the electrical context may be generated in mechanical, chemical and optical computing contexts and used for rules checking in those contexts.

The manner in which this database is generated will now be discussed below with respect to FIGS. 3A–3C. For purposes of illustration, it will be assumed that the static timing analyzer 10, shown in FIG. 2 and discussed above, is the PathMill static timing analyzer, in order to provide an example of one possible implementation of the present invention. However, those skilled in the art will understand that the electrical rules checker 100 of the present invention and the database of the present invention are not limited to use with any particular program.

The PathMill static timing analyzer provides an application program interface (API) which allows the PathMill static timing analyzer to communicate with the electrical rules checker 100 of the present invention. This API allows code external to the PathMill program to be linked to the PathMill program so that the external code and the PathMill program itself comprise one executable which can be run as a single program. The electrical rules checker 100 of the present invention utilizes this API to obtain information from the PathMill static timing analyzer which can be utilized by the electrical rules checker 100 to generate a database, as well as to detect clock driver outputs 102, in accordance with the present invention.

Prior to the database of the present invention being generated, the PathMill program runs and identifies circuit characteristics of the circuit under consideration such as, for example, FET direction, node types, latches, dynamic gates, clocks, rise and fall times, etc. Before the PathMill program terminates, it calls the electrical rules checker 100 of the present invention. The PathMill program has a feature commonly referred to as "hooks", which allows the PathMill program to call routines at various stages of execution. Once the PathMill program has finished identifying the characteristics mentioned above, the PathMill program calls the electrical rules checker 100 of the present invention. The electrical rules checker 100 of the present invention, through this series of subroutine calls, creates its own database of the circuit under consideration.

Figure 3A:
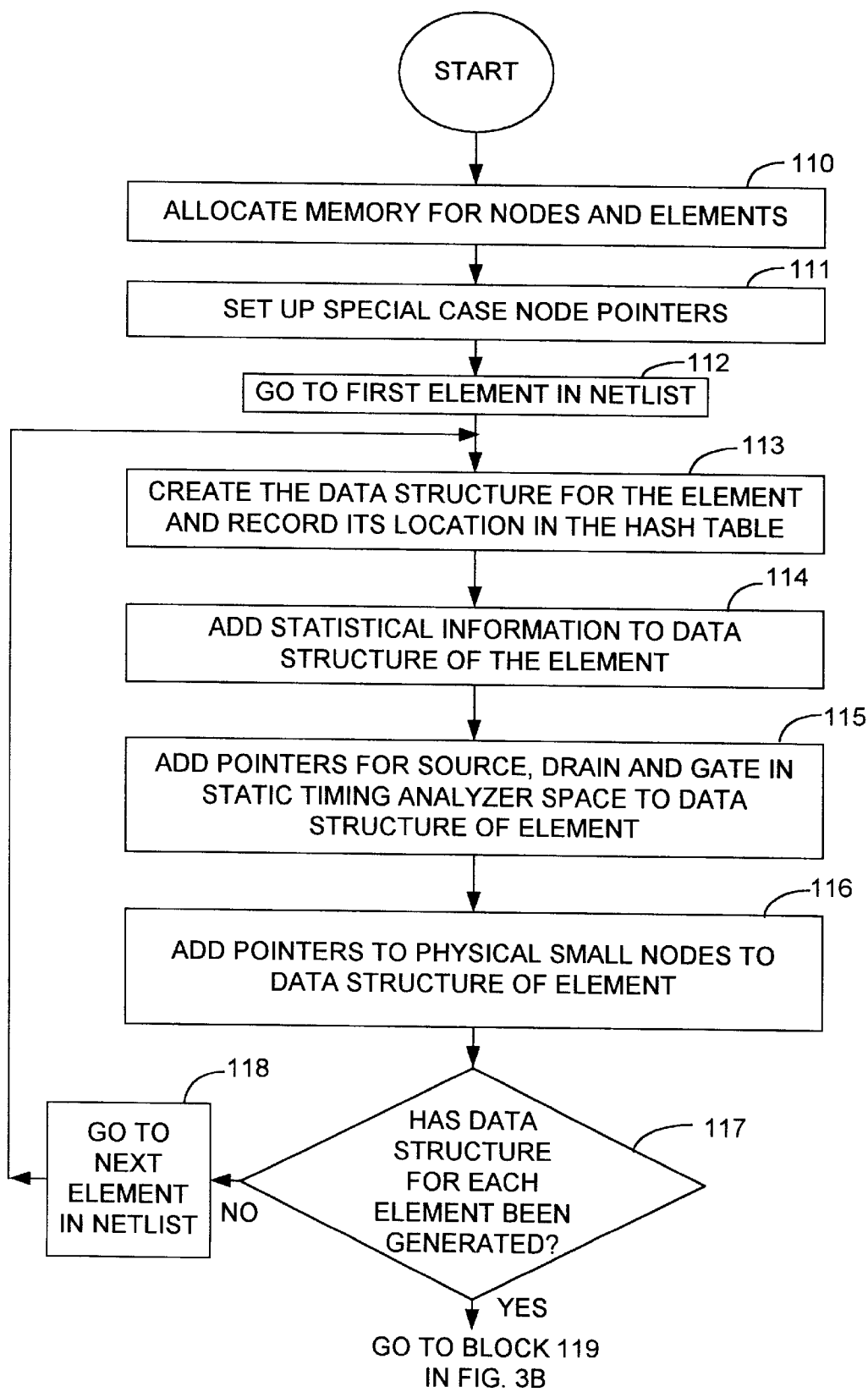
FIGS. 3A–3C collectively depict a flowchart that illustrates a process of generating a database of certain circuit element and node characteristics and properties that my be utilized by the preferred embodiment of the present invention to identify nodes susceptible to floating.
Figure 3B:
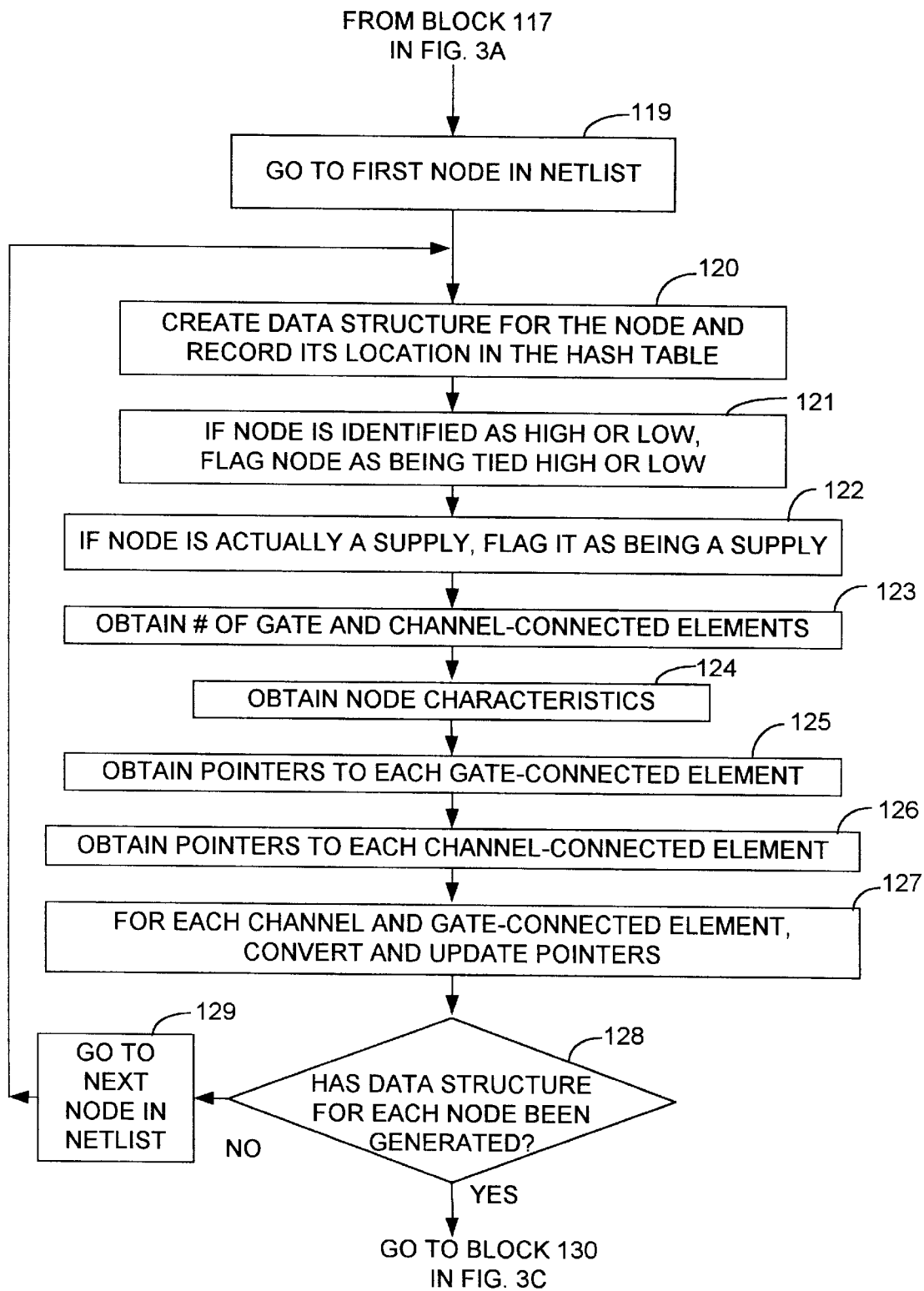

The first step in the process of generating the database is to allocate memory for the nodes and elements of the circuit, as indicated by block 110 in FIG. 3A. The PathMill program provides information via its API about the number of elements and nodes in the circuit of the electrical rules checker 100 and this information is utilized by the electrical rules checker 100 to perform memory allocation. Certain types of nodes and elements do not require as much information about their characteristics as do other types of nodes and elements. Therefore, the amount of memory allocated may vary for different types of nodes and elements. Rather than merely basing, memory allocation on the number of nodes and elements in the circuit, it may be desirable to distinguish between different types of nodes and elements so that memory can be more efficiently allocated. However, it will be apparent to those skilled in the art that the present invention is not limited with respect to the manner in which memory space is allocated for the nodes and elements. Those skilled in the art will understand the manner in which the memory allocation task, and any optimizations of it, can be performed. Therefore, in the interest of brevity, a detailed discussion of the memory allocation task for the nodes and elements will not be provided herein.

Once memory has been allocated for the nodes and elements, the next step in the process of the present invention is to set up node pointers for special cases of nodes, as indicated by block 111. These special types of nodes will be used repeatedly during the process of generating the database, as discussed below in more detail. Therefore, the pointers for these nodes preferably are set up relatively early in the database generation process. For example, nodes which correspond to the supplies (GND and VDD) are special types of nodes and it is helpful to set up node pointers for these types of nodes. This is done by finding the nodes whose names match the known names of the supply nodes.

For each element, a data structure must be generated which can be utilized by the electrical rules checker 100 in performing the rules checking tasks. Steps 113–116 in FIG. 3A correspond to the steps for creating the element data structures. The first element for which a data structure must be generated is obtained during the step represented by block 112. The data structure for that element is then generated and the location of the data structure is recorded in a hash table, as indicated by block 113. This step is performed so that the element pointers into the space of the static timing analyzer can be used later to look up the element data structures in the space of the electrical rules checker 100. Hash tables and the manner in which they are utilized are well-known in the art. Therefore, a detailed discussion of the manner in which the pointers into the space of the static timing analyzer are converted using the hash table into pointers into the space of the electrical rules checker 100 will not be provided herein since persons skilled in the art will understand the manner in which this can be accomplished.

Statistical information relating to the element is then added to the data structure of the element, as indicated by block 114. This information includes, for example, the width of the element, the length of the element, the direction of the element, and the element type. Once the statistical information has been included in the data structure of the element, the pointers for the source, drain and gate of the element, as defined in the space of the static timing analyzer, are included in the data structure of the element, as indicated by block 115. The pointers that were set up in step 111 are utilized in step 115. If either the source, drain or gate of the element is attached to ground or VDD, then the pointers for the source, drain and gate are set to the pointers for ground or VDD obtained in step 111.

A circuit and the nodes of the circuit can be represented logically or physically, or as a combination of both. A logical representation of a circuit primarily comprises FETs and does not include any resistors for representing parasitic resistance of the interconnect material. The logical representation of a node is identified in the PathMill program as a "supernode". On the other hand, a physical representation of a node, which is identified in the PathMill program as a "small node", includes FETs, but also includes resistors, which correspond to the parasitic resistance in the node. Therefore, in the physical representation, a small node exists between the resistors representing the parasitic resistance and between any FET and any one of the resistors. In the physical representation, FETs may be connected to different small nodes whereas in the logical representation, those same FETs may be connected to the same supernode.

Each element has a pointer to a supernode and to a small node for each drain, source and gate. Therefore, there are six pointers for each FET. Each small node in the physical representation maps to one particular supernode in the logical representation. In block 116, the pointers corresponding to these small nodes are added to the data structure of the element. A determination is then made at block 117 as to whether or not data structures for all of the elements have been generated. If not, the next element in the netlist is obtained, as indicated by block 118, and the process returns to block 113. If so, the process proceeds to block 119 in FIG. 3B.

Once the data structures for the elements have been generated, the data structures for the nodes must be generated. Blocks 120–127 in FIG. 3B correspond to the steps in the process of the present invention for generating the data structures of the nodes. The first node for which the data structure is to be generated is obtained at the step represented by block 119. The data structure for the node is then generated and the location of the data structure is recorded in the hash table, as indicated by block 120.

For the purpose of design quality analysis, it is important to distinguish actual supply nodes, such as VDD and GND, from other circuit nodes which have been declared to be tied high or low for the purpose of timing or other analysis. In block 121, the rules checker 100 determines, through the use of PathMill API calls, which nodes have been declared to be tied high or low, or are actually high or low because they are actual supply nodes. The rules checker 100 flags the actual high nodes as high and the actual low nodes as low in the step represented by block 121. In the step represented by block 122, the nodes which are actually supplies are flagged as supplies in the database.

The electrical rules checker 100 then obtains the number of gate-connected elements and the number of channel-connected elements from the static timing analyzer, as indicated by block 123. The electrical rules checker 100 also obtains the characteristics of the nodes from the static timing analyzer 10, as indicated by block 124. These characteristics include, for example, capacitance, node type, rise and fall time, etc. Once the characteristics of the node have been obtained, the electrical rules checker 100 obtains the pointers provided by the static timing analyzer 10 that point to each gate-connected element, as indicated by block 125. The electrical rules checker 100 then obtains the pointers from the static timing analyzer which point to each channel-connected element, as indicated by block 126.

The element pointers that are stored in the node during the steps represented by blocks 125 and 126 are pointers into the space of the static timing analyzer. Similarly, the node pointers that are stored in the element during the step represented by block 115 are pointers into the space of the static timing analyzer, except that the pointers to the VDD and GND nodes are stored as pointers to the VDD and GND nodes in the space of the electrical rules checker 100. In the step represented by block 127, some of these pointers are converted to point to the elements and nodes in the space of the electrical rules checker 100. For each of the gate-connected and channel-connected elements of the current node, the following steps are performed, which are represented by block 127:

(1) the element pointer is converted to the corresponding element pointer into the space of the electrical rules checker 100 by looking it up in the hash table. This element pointer replaces the original element pointer in the node structure;

(2) the source, gate, and drain pointers in the element data structure are each checked to see if they point to the current node. If so, the node pointer (into the space of the static timing analyzer) is replaced with the pointer to the current node in the space of the electrical rules checker.

A determination is then made at block 128 as to whether or not data structures for all of the nodes have been generated. If not, the next node in the netlist is obtained, as indicated by block 129, and the process returns to block 120.

Figure 3C:
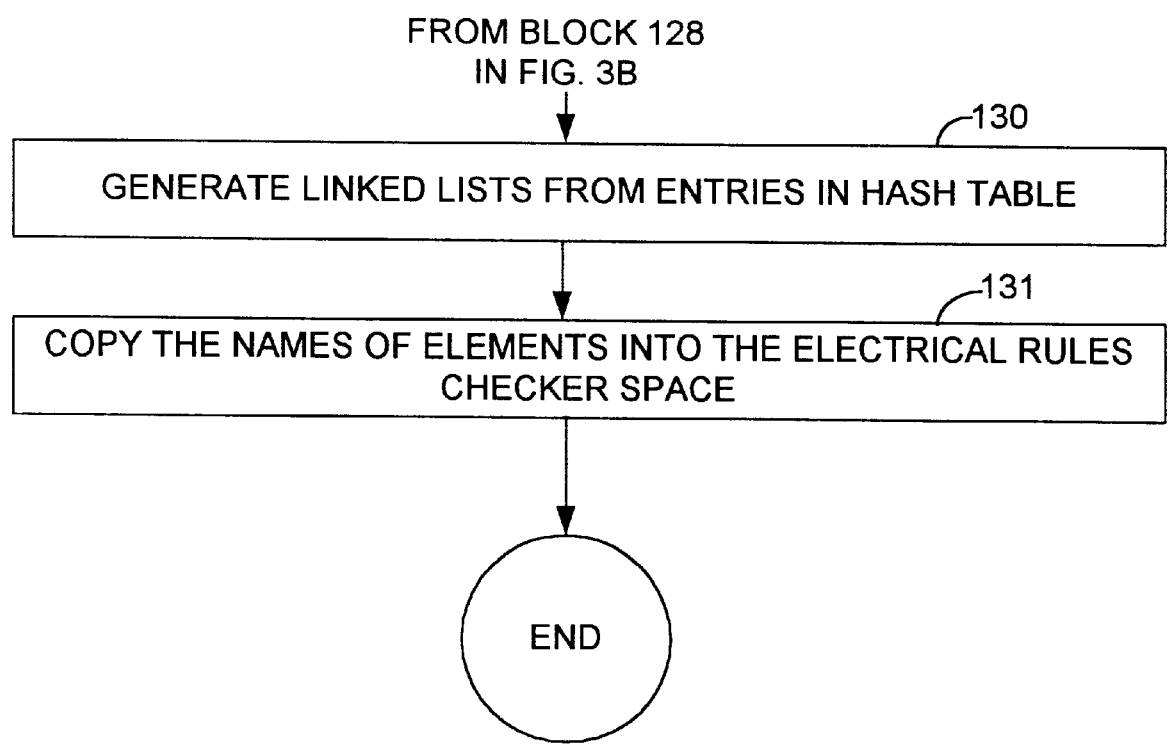

In order to enable the electrical rules checker 100 to maximize efficiency in searching the database of the present invention, once the data structures for all of the nodes have been created, linked lists of elements and nodes are generated from the entries in the hash table, as indicated by block 130 in FIG. 3C. These lists are used by the electrical rules checker 100 of the present invention in searching for an element in the database of the present invention. When searching for an element, the electrical rules checker 100 simply analyzes the elements contained in the linked list.

It should be noted that the arrangement of the elements and nodes in the linked lists may or may not have any physical relationship to the arrangement of the elements and nodes in the circuit under consideration. Thus, the linked lists are merely used to search through the elements and nodes stored in the database.

Once the linked lists have been generated, the names of the elements and nodes contained in the linked list are copied into electrical rules checker space, as indicated by block 131. This reduces the number of calls that need to be made to the PathMill program by the electrical rules checker 100. Once the database of the present invention has been generated, no more calls have to be made to the PathMill program via the PathMill API. The database of the present invention is comprised as the binary file 106 shown in FIG. 2.

Once the database of the present invention has been generated in the manner described above, the electrical rules checker 100 of the present invention utilizes this database to perform the rules checking tasks. As previously mentioned, one such task, and the one performed by the present invention is the identification of clock driver output nodes 102.

Having described the environment of the present invention, as well as the steps of generating a database of information pertaining to the various elements and nodes within a netlist file, reference will now be made in more detail to the preferred embodiment of the present invention. In this regard, reference is made briefly to FIG. 4, which illustrates a portion of a data structure that may be created as part of the database, and utilized in reference to a given node of the netlist file. As previously mentioned, for a given node within the netlist file, a plurality of flags may be set for various characteristics and attributes associated with a given node. Two such characteristics or attributes that may be utilized by a system and method of the present invention include "Clock" (i.e., whether or not the given node is associated with a 10 clock driver), and "Clock Output" (i.e., whether or not the given node is an output node of a clock driver. The "Clock" information may be obtained from PathMill, or some other software package of similar nature. Alternatively, this value may be directly computed by the system and method of the present invention. This computation, however, may be conducted in a manner which will be appreciated by those skilled in the art, and therefore need not be described herein. In addition, a pointer called "Static Inverse of" may also form part of the data structure for each node within the database. If this node is the static inverse of another node, this pointer may be set to point to that other node.

As summarized above, the present invention operates to determine whether a specified node is an output node of a clock driver circuit. If so, then a flag within the data structure may be so set. In this regard, a clock driver output node will generally be identified as an output node in a circuitous inverter loop. To illustrate an inverter loop, reference is briefly made to FIG. 5, which shows inverters 202 and 204 configured in an inverting loop, with interim nodes N1 and N2. As is known by those skilled in the art, an inverter may be constructed from a pair of series connected FETs 212 and 214. Specifically, the channel nodes of the two FETs 212 and 214 are series connected between VDD and ground. A first node N1 (or signal) drives the gate nodes of both FET devices 212 and 214. The output node N2 is then taken from the node interconnecting the two FETs 212 and 214. Specifically, the FETs 212 and 214 include a PFET 212 and an NFET 214. When the value on node N1 is zero, PFET 212 is turned on, while NFET 214 is turned off, thereby providing an output on node N2 of VDD (or logic 1). Conversely, when a logic high signal is provided on node N1, then NFET 214 is turned on, while PFET 212 is turned off. As a result, NFET 214 pulls node N2 down to ground, thereby providing a logic zero on the output of node N2.

Figure 6A:
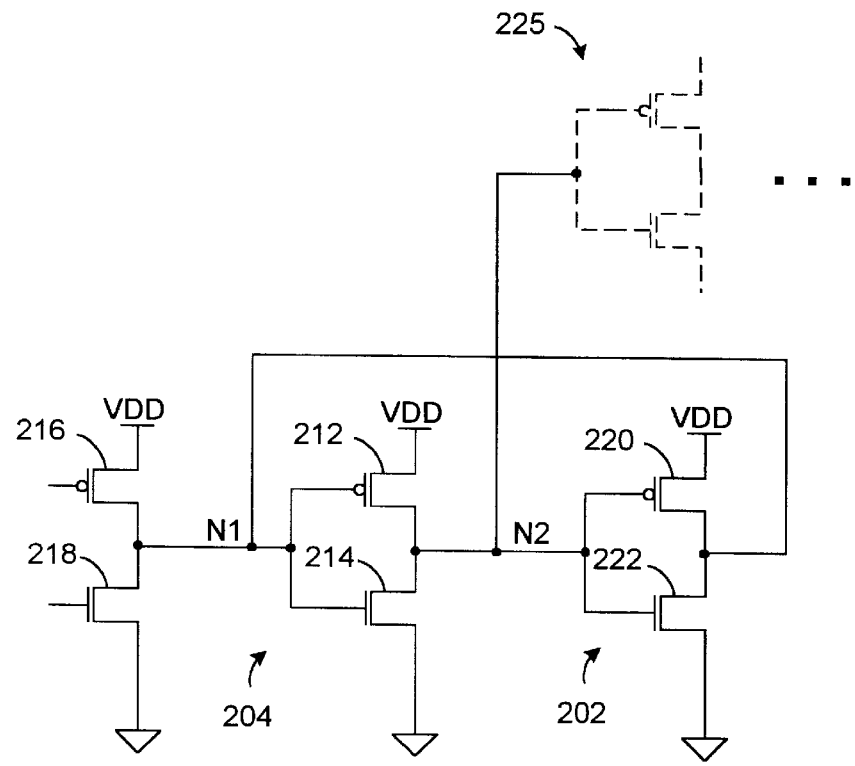
FIG. 6A is a schematic diagram illustrating a portion of a clock driver circuit.

To better illustrate the concepts and teachings of the present invention, reference is now made to FIG. 6A, which is a schematic diagram illustrating a clock driver output node N2. Like the circuit illustrated in FIG. 5, node N2 is an interim node of an inverter loop including inverter 202 and inverter 204 comprised of FETs 212 and 214. In addition, a separate inverter element, comprised of FETs 220 and 222, is configured to drive node N1 as well. Additional circuitry 225, illustrated in dashed line, may also be disposed to be driven by the clock output node N2. A further FET configuration, comprising FETs 216 and 218, is configured to drive node N1.

In accordance with the present invention, node N2 is identified as a clock driver output node. In short, for each FET device that is channel connected to the specified node, the present invention identifies the node as an output node (e.g., node N2) of a clock driver by evaluating the gate node (i.e., node N1) to determine whether the signal that drives the gate node drives only gate nodes of FET devices of a similar type (i.e., n-type or p-type), or whether the signal drives gate nodes of FET devices of a different type (e.g., one PFET and one NFET). If the gate node of any FET device that is channel connected to the specified node drives gate nodes of only one type of FET device, then the specified node will be identified as a node other than an output node of a clock driver circuit.

As particularly applied in connection with the circuit diagram of FIG. 6A, when evaluating node N2, the invention will independently evaluate the gate nodes of each FET that is channel connected to the node, which are FETs 212 and 214. First, it may evaluate the gate node of FET 212 to discover that the signal that drives the gate of this FET also drives the gate node of FET 214. The invention may fuirther recognize that FET 212 is a p-type FET, while FET 214 is an n-type FET. A similar determination may be made when FET 214 is evaluated. In summary, the invention will determine that there are no FETs channel connected to node N2 having gate nodes that are driven by a signal that does not also drive a FET gate of an opposite type. Therefore, the invention will deem node N2 to be an output node of a clock driver.

Figure 6B:
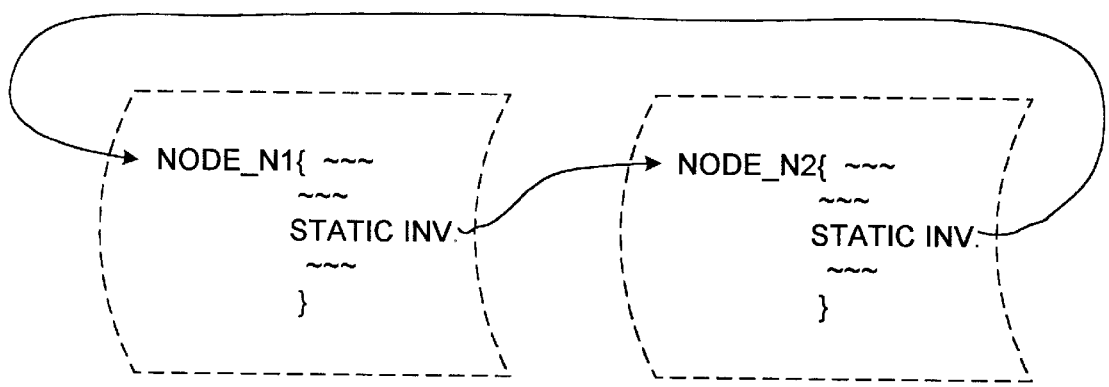
FIG. 6B is a diagram illustrating a portion of a data structure for two nodes within a schematic, depicting the manner in which "Static Inverse" pointers cross-point, for nodes in an inverter loop.

In addition, and integral to this determination is the recognition that node N2 is part of an inverter loop of a clock driver circuit. The determination that node N2 is part of a clock driver circuit may be provided by Pathmill, or separately computed in a manner that will be appreciated by persons skilled in the art. The identification of node N2 as being part of an inverter loop may be made by evaluating the data structure of the node. Preferably, and as illustrated in FIG. 6B, reference may be made to a "Static Inverse of" pointer within the data structure. As previously mentioned, the electrical rules checker 100 generates a database of information regarding circuit elements and circuit nodes. One portion of that information, for every node, may be an identification of a static inverse node, if one exists. A static inverse node is one which has, under static conditions, a state or value that is the logical inverse of the current node. Thus, the input and output nodes of an inverter element will be the static inverse of each other. The invention, then, may evaluate the static inverse pointer of a current node (e.g., node N2) and see that it points to node N1 (FIG. 6B). Likewise, the invention may then evaluated the static inverse pointer of node N1 and see that it points back to node N2. In this way, the invention may recognize nodes N1 and N2 as forming an inverter loop.

To illustrate a node that is not the output of a clock driver, consider the evaluation of node N1. Node N1 will be determined (e.g., by PathMill) to be a part of a clock circuit, and further to be a node within an inverter loop. However, the invention will further evaluate the gate nodes of every FET that is channel connected to the node N1. In the illustrated embodiment, this will include FETs 220, 222, 216, and 218. When evaluating the gate of FET 216, the invention will recognize FET 216 to be a p-type FET. However, the signal that drives the gate node of this FET, will not be further identified to drive the gate node of an n-type FET. As a result, the invention will deem node N1 not to be the output of a clock driver.

Figure 7:
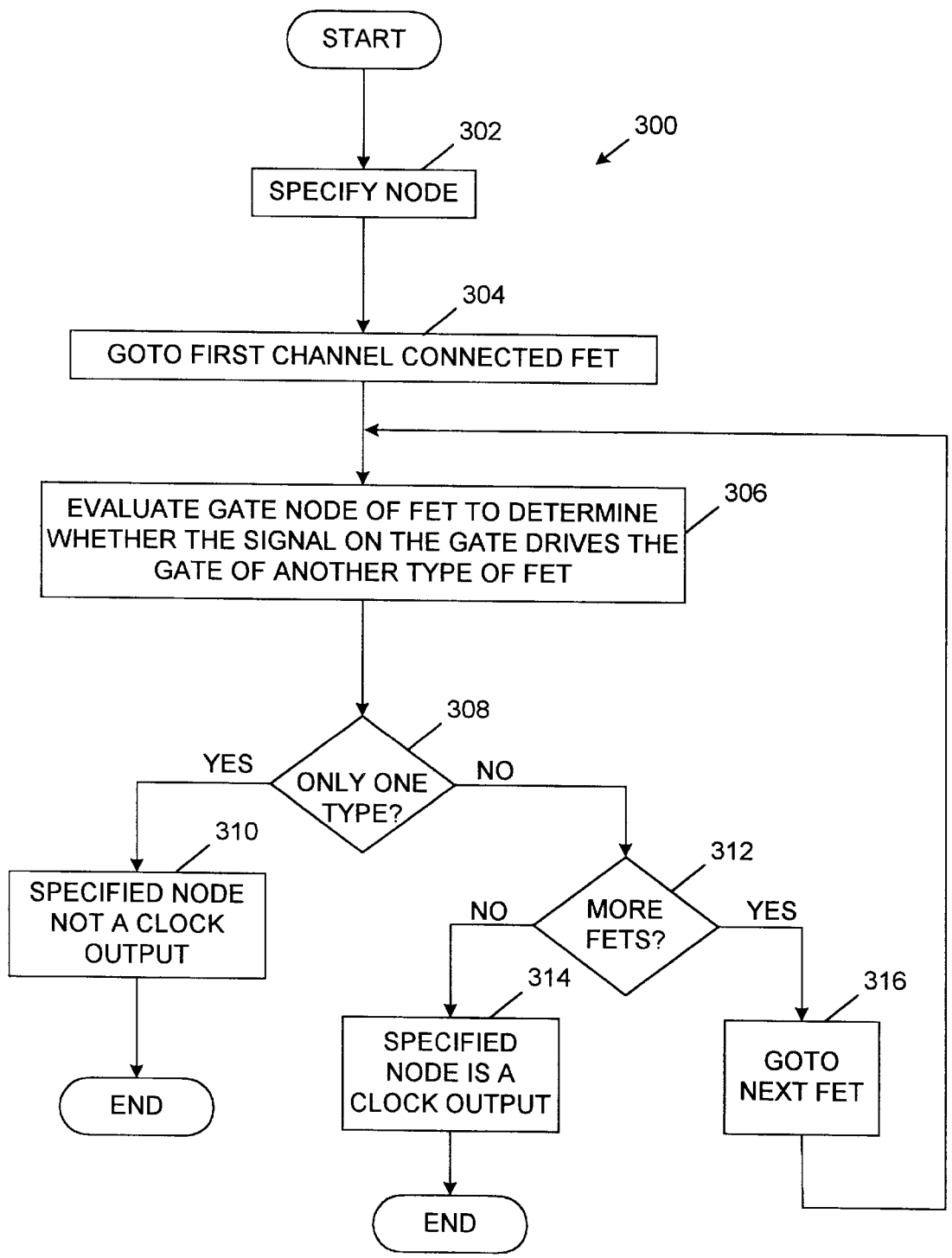
FIG. 7 is flowchart illustrating a top-level functional operation of a method in accordance with the present invention.

Having illustrated circuitry that depicts the present invention, reference is now made to FIG. 7, which is a flow chart 300 illustrating the top-level functional operation of a system constructed in accordance with the present invention. In a first step, the program of the present invention may specify a node to be evaluated, for purposes of determining whether the node is an output node of a clock driver (step 302). For a given, specified node, the program then may loop on all FET devices that are channel connected to the specified node. As previously mentioned, for each FET device that is channel connected to the specified node, the program may evaluate the gate node to determine whether the signal that drives the gate node drives only gate nodes of FET devices of a similar type (i.e., n-type or p-type), or whether the signal drives gate nodes of FET devices of a different type (e.g., one PFET and one NFET). If the gate node of any FET device that is channel connected to the specified node drives gate nodes of only one type of FET device, then the specified node will be identified as a node other than an output node of a clock driver circuit.

More particularly, the program will proceed to a first FET device that is channel connected to the specified node (step 304). It will then evaluate the gate node of the current FET device to determine whether the signal that drives this gate node also drives the gate node of another type of FET device (step 306). Therefore, if the current FET is a NFET, the program will evaluate the signal that drives the gate node of the NFET to determine whether that same signal also drives a gate node of a PFET. Likewise, if the current node is a PFET, then the program will evaluate the signal that drives the gate node to determine whether that same signal also drives gate node of a NFET. At step 308, the program determines whether only one type of FET is driven by the signal that drives the gate node of the current FET.

If the signal that drives the gate node of the current FET drives onle one type of FET, then the program recognizes that the specified node is not a clock driver output node (step 310). Accordingly, the program may set a corresponding flag within the data structure for the netlist node (see FIG. 4). If, however, the signal that drives the gate node of the current FET, in fact, drives more that one type of FET (i.e., step 308 resolves to no), then the program proceeds to step 312, where it determines whether there are additional FETs that are channel connected to the specified node. If not, then the program determines that the specified node is, indeed, a clock output (step 314). The program may then set the appropriate flag in the data structure for the given node of the netlist. If, however, step 312 determines that there are additional FETs that are channel connected to the specified node, then the program will proceed to the next FET (step 316) and return to step 306, where it will evaluate the next FET (now the current FET) in the manner described above in connection with step 306 through 314.

Figure 8A:
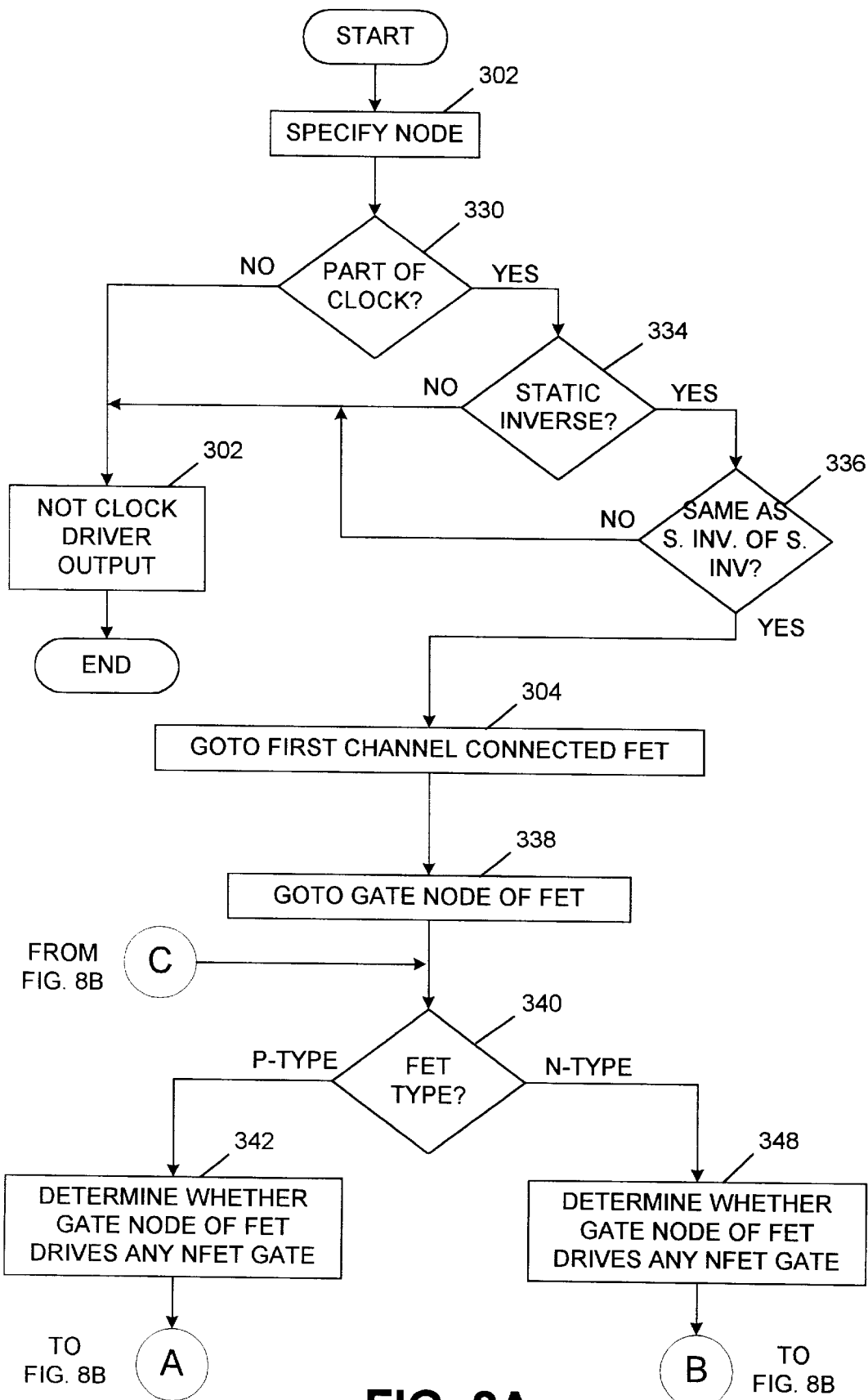
FIGS. 8A and 8B, collectively, comprise a flowchart illustrating a more detailed functional operation of a method in accordance with one embodiment of the present invention.
Figure 8B:
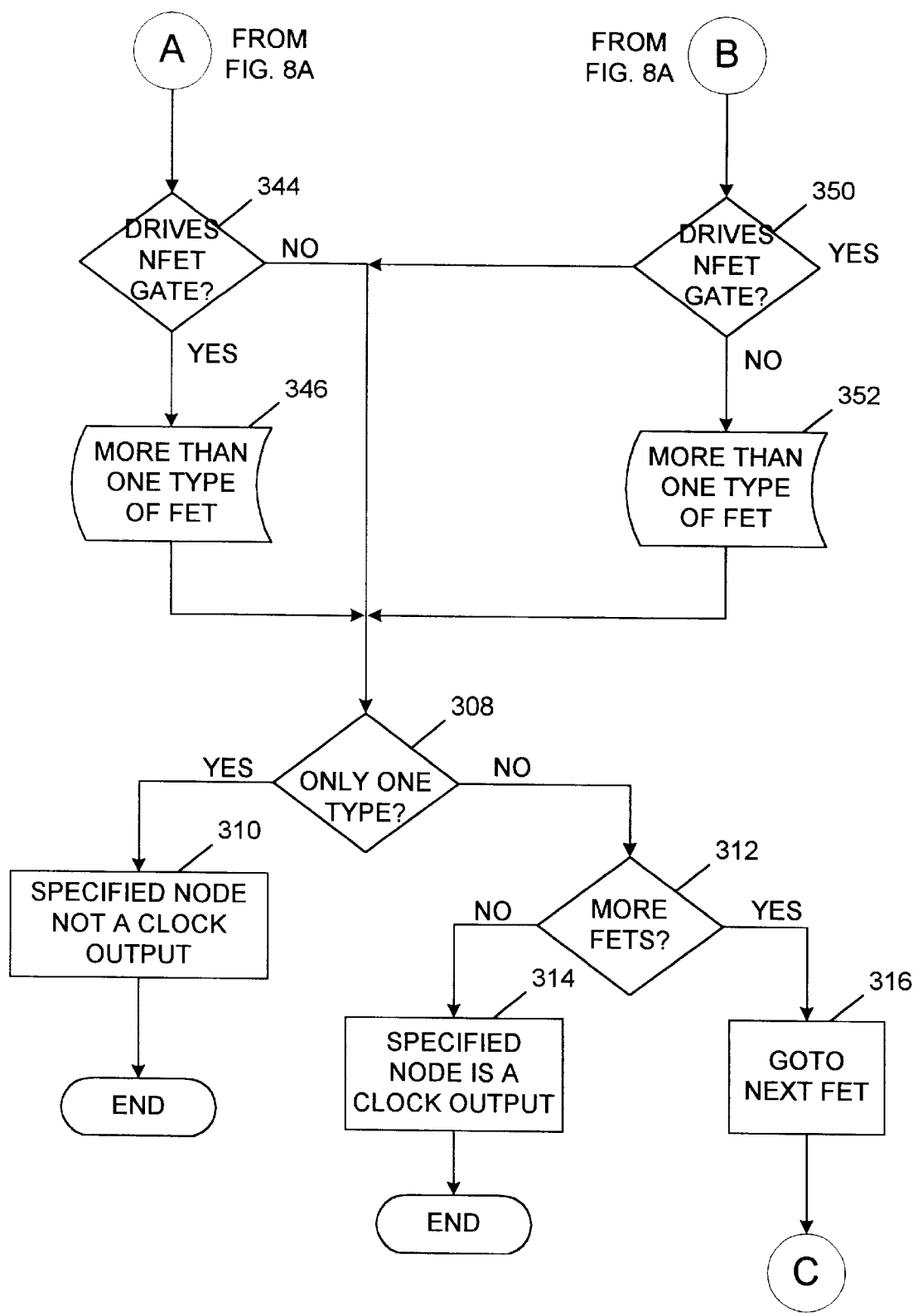

Having described a top-level operation of a method constructed in accordance with the invention, reference is now made to FIG. 8, which is a flowchart illustrating a more detailed implementation of a preferred embodiment of the present invention. Where appropriate, the top-level steps that were described in connection with FIG. 7 are also illustrated in FIG. 8, with like reference. First, the method may begin by specifying and node (step 302) for which the method evaluates to determine whether the specified node is an output node of a clock driver.

Before reaching some of the evaluation steps described in FIG. 7, the program may make certain checks to initially rule out certain nodes that may be readily determined to be something other than a clock driver output node. In this regard, the method may perform a check to determine whether the specified node is a clock (i.e., a node that propagates a clock signal) (step 330). As previously mentioned, a clock driver output node, and therefore an interim node in a clock driver circuit, will be a node in a circuitous inverter loop. The information for step 330 may be obtained through PathMill, or alternatively may be separately computed by a portion of the electrical rules checker 100. The particular manner in which the determination of step 330 is made is not deemed to form a part of the present invention, and therefore need not be discussed further herein. Suffice it to say, if the program determines that the specified node is not part of a clock circuit, then the program may readily determine (at an initial stage) that the specified node is not an output node of a clock driver (step 332).

If, however, the specified node is a clock node, then the program may determine whether the specified node is the static inverse of another node. In the preferred implementation, the data structure for each node includes a flag that specifies (by using a pointer) another node within the netlist (if one exists) that is the static inverse of the current node (step 334). Thus, for example, if a portion of the circuit under evaluation includes an inverter, the input node to the inverter will specify the output node of the inverter as the static inverse of the input node. Of course, this determination may be made an alternative manner, or even computed on the fly, consistent with the broader concepts of the present invention.

If there is no static inverse of the specified node, the program determines that the specified node is not a clock driver output (step 332). If, however, a static inverse node is identified for the specified node, then the program determines whether the specified node is the static inverse of the static inverse of the specified node (step 336). More specifically, as illustrated in FIG. 6B, the preferred implementation of the program of the present invention specifies a static inverse pointer within a node data structure, for each node in a netlist file. This static inverse pointer points to the node that is the static inverse of the specified node. The program may proceed to the data structure of the node specified by the "Static Inverse of" pointer to determine whether that data structure element also defines a static inverse node. Specifically, the program evaluates the "Static Inverse of" pointer of the netlist node data structure for the specified node (i.e., node N2) to determine whether that static inverse pointer of that node (i.e., Node N2) points back to the specified node (e.g., Node N1). If so, then the program recognizes that the specified node forms a part of an inverter loop. If this inverter loop is not present, then the program determines that the specified node is not a clock driver output node (step 332).

If, however, step 336 resolves to yes, then the program may proceed to step 304, as described in connection with FIG. 7, where it proceeds to a first channel connected FET. From there, the program evaluates the gate node of the current FET to determine whether the gate node is connected to a gate node of another FET that is not the same type (i.e., p-type or n-type) of FET as the current FET. More particularly, to make this determination the program proceeds to the gate node of the current FET (step 338). It then determines whether the current FET is a p-type FET or a n-type FET (step 340). If the current FET is a p-type FET, then the program may determine whether the gate node of the current FET drives the gate node of any nFET (steps 342 and 344). If so, then the program recognizes that the signal driving the gate node of the current FET drives more than one type FET (step 346). From here, the program may proceed to step 308, and continue on from there, as described in connection with FIG. 7.

If step 340 determines that the current FET is a n-type FET, then the program may determine whether the gate node of the current FET drives the gate node of any pFET (steps 348 and 350). If so, then the program recognizes that the signal driving the gate node of the current FET drives more than one type FET (step 352). From here, the program may proceed to step 308, and continue on from there, as described in connection with FIG. 7.

Pseudo Code

To better illustrate the preferred implementation of the present invention, reference is made to the following segments of pseudo code. Specifically, a preferred implementation may include two routines, which are set forth below. A first routine (called "Node_has_one_type_FET_gate") evaluates the individual gate nodes of all FETs channel connected to a specified NODE, to determine whether the gate node of any channel connected FET is configured to drive only one type (i.e., p-type or n-type) of FET. If this first routine determines that there is only one type of FET driven by each such gate node, then the it returns a Boolean value of TRUE, which indicates that that the specified NODE is internal to a clock driver, and is not the clock driver output. Otherwise, it returns a Boolean value of FALSE.

The second routine (called "Node_is_clock output") evaluates a given node to determine whether a specified node is an output of a clock driver circuit. As a part of the evaluation of the second routine, the second routine calls the first routine. If the specified node is determined to be a clock driver output, then the second routine returns Boolean a value of TRUE. Otherwise, it returns a Boolean value of FALSE.

The variable NODE is passed as an input to each of the two routines. This variable is a pointer that specifies the netlist location of the node to be evaluated. In each of the pseudo code routines set forth below, brackets ("{" and "}") delineate the beginning and ending points of a loop or "if/then" block. An exclamation point ("!") delineates a comment line (i.e., all text that follows the exclamation point), which does not form part of the pseudo code, but is provided merely for purposes of better illustration in explaining a portion of the pseudo code.

```
Routine "Node_has_one_type_FET_gate(NODE)"
{
    set variable nFET_gates = FALSE;
    set variable pFET_gates = FALSE;
    Loop on all FET elements that are gate
    connected to NODE
        ! Loop variable is called "ELEM"
        {
        if (ELEM is n-type)
            {
            then
                if (pFET_gates = TRUE)
                    then return FALSE;
                else
                    set nFET_gates = TRUE;
            }
        if (ELEM is p-type)
            {
            then
                if (nFET_gates = TRUE)
                    then return FALSE;
                else
                    set pFET_gates=TRUE;
            }
        } ! End loop of channel connected FET elements
    return TRUE;
    ! Note that this last line will not be executed if any of the
    ! previous "return FALSE" instructions were executed
End Routine;
Routine "Node_is_clock_output(NODE)"
{
    if (NODE is not part of a clock circuit)
        then return FALSE;
    if (NODE is not the static inverse of any other node)
        then return FALSE;
    if (the static inverse of the static inverse of NODE is not itself)
        then return FALSE;
    Loop on all FET elements that are channel connected to NODE
        ! Loop variable is ELEM1
        {
        if (Node_has_only_one_type_FET_gate
           (Gate of ELEM1))
            then return FALSE;
        } ! End Loop of channel connected FET elements
    Return TRUE;
    ! Note that this last line will not be executed if any of the
    ! previous "return FALSE" instructions were executed
End Routine;
```

Figure 9:
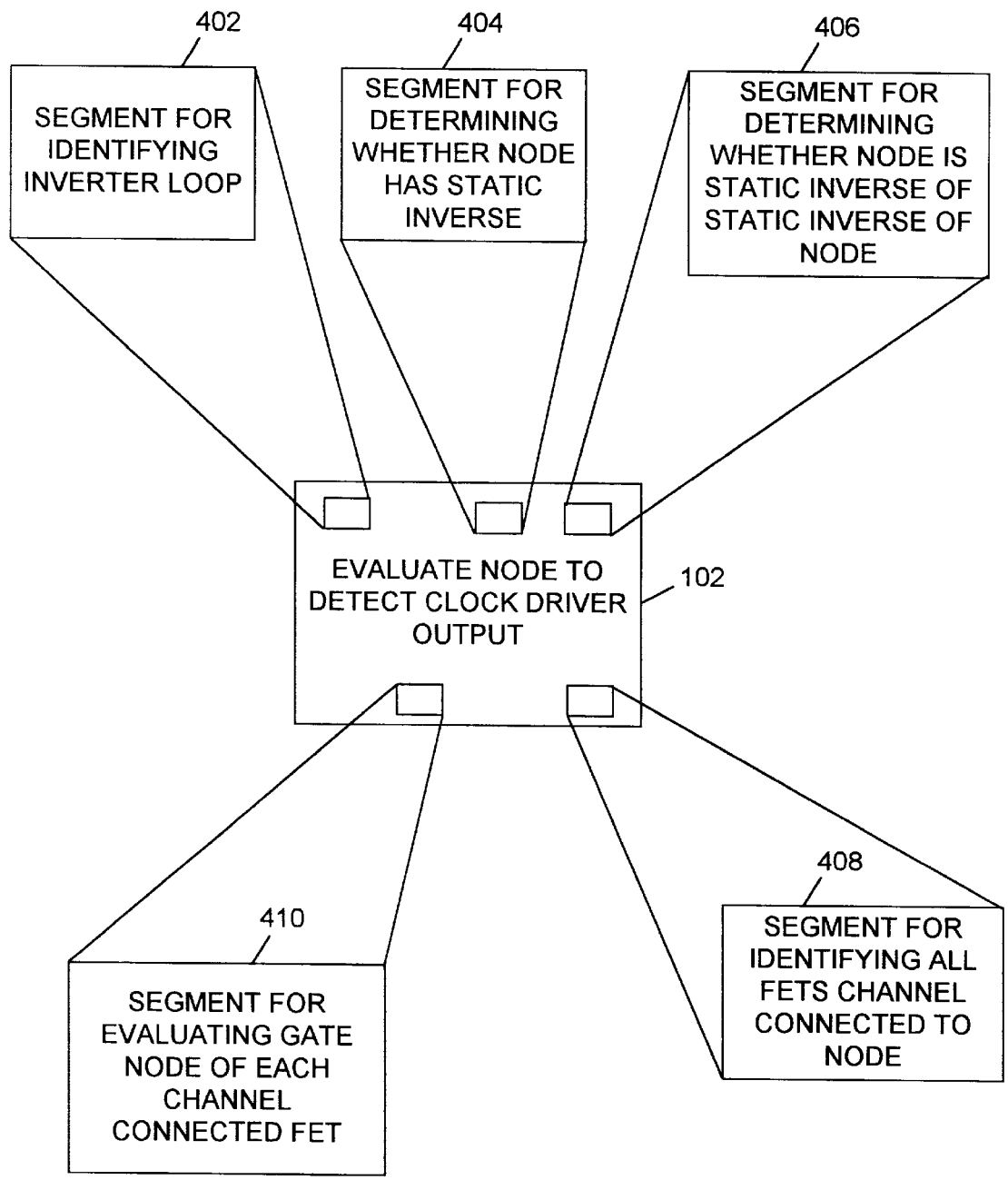
FIG. 9 is a block diagram illustrating certain fundamental code segments comprising a system constructed in accordance with the invention.

In keeping with the broader aspects of the invention, it will be appreciated that the steps illustrated in the flow charts of FIGS. 3A–3C, 7, 8A and 8B are provided for purposes of illustration and are not deemed to be limiting on the broader aspects of the present invention. Indeed, the broader aspects of the invention may be implemented using a variety of different approaches that are still consistent with the scope and content of the present invention. As illustrated in FIG. 2, a portion 102 of the electrical rules checker program 100 of the present invention is configured to evaluate a node of a netlist to determine whether the node is on output of a clock driver circuit. In the preferred embodiment, the system comprises software which may be provided on a computer readable storage medium in the form of code segments that are particularly configured to perform various functions. In this regard, reference is now made to FIG. 9 which illustrates certain functions which may be carried out by a system constructed in accordance with the teachings of the invention. For example, a first code segment 402 may be provided to identify an inverter loop, and more particularly, to identify a specified node is a part of an inverter loop. Another segment 404 may be provided to determine whether a specified node has a static inverse. Another segment 406 may be provided to determine whether a specified node is a static inverse node of the static inverse node of the specified node (e.g., a determination made in identifying an inverter loop). Still another segment 408 may be provided for identifying all FETs that are channel connected to a specified node. Yet another segment 410 may be provided for evaluating the gate node of each FET identified as being channel connected to the specified node. Consistent with the broader concepts of the invention, additional, fewer, or different segments may also be provided.

It should be appreciated that the flow charts of FIGS. 3A–3C, 7, 8A and 8B show the top-level operation of only one possible implementation of the methods of the present invention. In this regard, each block represents a module, segment, or portion of code, which comprises one or more executable instructions for implementing the specified logical function(s). It should also be noted that in some alternative implementations, the functions noted in the blocks may occur out of the order noted in FIGS. 3A–3C, 7, 8A and 8B. For example, two blocks shown in succession may in fact be executed substantially concurrently or the blocks may sometimes be executed in the reverse order, depending upon the functionality involved.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. A method for determining whether a circuit node is an output node of a clock driver circuit comprising the steps of:
   ensuring that the node is a clock node;
   ensuring that the node is a node within an inverter loop;
   identifying every FET that is channel connected to the node; and
   for every identified FET, ensuring that a signal that drives a gate node of the FET also drives a gate node of a different type FET.

2. The method as defined in claim 1, further including the step of determining whether the node has a static inverse.

3. The method as defined in claim 2, wherein the step of determining whether the node has a static inverse fuirther includes the step of evaluating a data structure for the node, and more specifically determining whether a static inverse pointer within the data structure points to another node.

4. The method as defined in claim 2, further including the step of ensuring that the node is the static inverse of another node, wherein the another node is defined by the node as the static inverse of the node.

5. The method as defined in claim 4, wherein the step of determining whether the node is the static inverse of another node further includes the step of evaluating a data structure for the node and the another node, and more specifically determining whether a static inverse pointer within the data structure points to the another node, and whether a static inverse pointer within the data structure of the another node points to the node.

6. The method as defined in claim 1, wherein the step of ensuring that a signal that drives a gate node of the FET also drives a gate node of a different type of FET further includes the step of evaluating a netlist file to determine the type of the FET that is channel connected to the node.

7. The method as defined in claim 6, wherein the step of ensuring that a signal that drives a gate node of the FET also drives a gate node of a different type of FET further includes the step of evaluating the netlist file to determine the other elements electrically connected to the gate node of the FET.

8. The method as defined in claim 7, further including the steps of determining the type of all other elements electrically connected by their gates to the gate node of the FET, and determining whether any of those elements are a different type than the FET.

9. A method for determining whether a circuit node is an output node of a clock driver circuit comprising the steps of:
   ensuring that the node is a clock node;
   ensuring that the node is a node within an inverter loop; and
   ensuring that a gate node of every FET (first FET) that is channel connected to the node is electrically connected to a gate node of another FET, wherein the another FET is a different type than the first FET.

10. A computer readable medium containing program code for controlling the execution of a method for determining whether a node is an output node of a clock driver comprising:
    a first segment configured to ensure that the node is a clock node;
    a second segment configured to ensure that the node is a node within an inverter loop;
    a third segment configured to identify every FET that is channel connected to the node; and
    a fourth segment configured to ensuring that a signal that drives a gate node of the FET also drives a gate node of a different type FET, for every identified FET.

11. The computer readable medium as defined in claim 10, further including a fifth segment configured to determine whether the node has a static inverse.

12. The computer readable medium as defined in claim 11, wherein the fifth segment further includes a segment configured to evaluate a data structure for the node, and more specifically to determine whether a static inverse pointer within the data structure points to another node.

13. The computer readable medium as defined in claim 11, further including a sixth segment configured to determine whether the node is the static inverse of another node, wherein the another node is defined by the node as the static inverse of the node.

14. The computer readable medium as defined in claim 13, wherein the sixth segment further includes a segment configured to evaluate a data structure for the node and the another node, and more specifically to determine whether a static inverse pointer within the data structure points to the another node, and whether a static inverse pointer within the data structure of the another node points to the node.

15. The method as defined in claim 10, wherein the fourth segment further includes a segment configured to evaluate a netlist file to determine the type of the FET that is channel connected to the node.

* * * * *